United States Patent

Gabriele

[11] Patent Number: 5,922,414
[45] Date of Patent: Jul. 13, 1999

[54] PROCESS FOR PLATING

[75] Inventor: Peter Gabriele, Bristol, Conn.

[73] Assignee: MacDermid Incorporated, Waterbury, Conn.

[21] Appl. No.: 08/987,682

[22] Filed: Dec. 9, 1997

Related U.S. Application Data

[63] Continuation-in-part of application No. 08/724,143, Sep. 30, 1996, abandoned.

[51] Int. Cl.$^6$ .......................................................... C08F 2/46
[52] U.S. Cl. .......................... 427/487; 427/265; 427/270; 427/271; 427/385.5; 427/404; 427/407.1; 427/443.1; 427/510; 427/532; 427/555; 427/558; 427/559; 427/595; 427/596
[58] Field of Search ..................................... 427/487, 265, 427/270, 271, 385.5, 404, 407.1, 443.1, 510, 532, 555, 558, 559, 596, 595

[56] References Cited

U.S. PATENT DOCUMENTS

| | | |
|---|---|---|
| 3,982,045 | 9/1976 | Kukanskis et al. . |
| 4,444,848 | 4/1984 | Shanefield et al. . |
| 4,724,005 | 2/1988 | Minten et al. . |
| 4,834,976 | 5/1989 | Kondo et al. . |
| 4,847,114 | 7/1989 | Brasch . |
| 4,882,245 | 11/1989 | Gelorme et al. . |
| 4,976,990 | 12/1990 | Bach et al. . |
| 5,132,038 | 7/1992 | Kukanskis et al. . |
| 5,246,817 | 9/1993 | Shipley, Jr. . |
| 5,296,334 | 3/1994 | Castaldi et al. . |
| 5,322,976 | 6/1994 | Knudsen et al. . |
| 5,332,465 | 7/1994 | Kuzmik et al. . |

*Primary Examiner*—Bernard Pianalto
*Attorney, Agent, or Firm*—John Cordani

[57] ABSTRACT

A composition comprising at least two resins with widely different molecular weights is disclosed. The composition is particularly suitable as a permanent dielectric which provides an optimum surface for plating upon. The composition is particularly useful in the fabrication of printed circuit boards.

17 Claims, No Drawings

PROCESS FOR PLATING

This application is a continuation-in-part of U.S. patent application Ser. No. 08/724,143 which is now abandoned and was filed on Sep. 30, 1996.

FIELD OF INVENTION

The present invention relates to a dielectric composition which is particularly useful in forming substrates that are susceptible to being plated upon with a high degree of adhesion and reliability. The present invention is especially suited to the manufacture of printed circuits of various types. The composition may be used to formulate photodefinable or thermosetting resins which are platable with acceptable adhesion and reliability. The composition is useful as a permanent dielectric. As used herein "permanent resist" shall mean a permanent dielectric.

BACKGROUND OF INVENTION

In general, many processes have been developed to plate upon dielectric or plastic substrates with good adhesion and reliability. Most of these processes have focused on developments in the plating cycle itself to achieve superior plating results. For example, see U.S. Pat. Nos. 5,332,465; 5,132,038; and 4,976,990 the teachings each of which are incorporated herein by reference in their entirety. In general these plating processes accept the substrate as given and then develop plating cycles to plate the substrate.

This invention on the other hand has focused on the substrate composition and seeks to disclose substrate compositions which are particularly suitable to be plated upon with known plating cycles. In this regard the compositions disclosed herein are particularly useful in the manufacture of printed circuit boards, where exceedingly demanding results are required. However, the compositions disclosed are also useful in forming other substrates which are to be plated upon including, with limitation, plastic (dielectric) parts which are to be plated such as faucets, decorative parts, plastic encasements which are to be plated for resistance to electro magnetic radiation, and other functional substrates. As such, the instant invention will be further explained in the context of printed circuit manufacture, but will be seen by those skilled in the art as readily applicable to other similar applications such as the foregoing.

Printed circuit boards utilize a variety of resists in their manufacture. Typically the resists used are of a temporary or non-permanent type, meaning that the resist is used to create an image and then is later stripped from the surface. Various resists of this type are known and used in the art.

Printed circuit board designs using "permanent resists" are also known. A permanent resist is one which is used to create an image on a surface of the printed circuit board and then remains as an integral part of that surface (i.e. is not stripped away) and is usually subsequently plated upon. Permanent resists used in the manufacture of printed circuit boards are described in U.S. Pat. No. 3,982,045 issued Sep. 21, 1976 to Kukanskis, the teachings of which are incorporated herein by reference in their entirety. In addition see U.S. Pat. No. 4,882,245 issued to Gelorme et al, the teachings of which are incorporated herein by reference in their entirety. Also see U.S. Pat. Nos. 5,246,817 and 5,322,976, the teachings of which are incorporated herein by reference in their entirety. Shanefield et al., in U.S. Pat. No. 4,444,848, the teachings of which are incorporated herein by reference in their entirety, describes a modified epoxy material which plates with improved adhesion.

Attempts to manufacture useful permanent resists and printed circuit boards and packages using such resists have uncovered a number of difficulties. For a discussion of soldermasks and their compositions please refer to U.S. Pat. No. 5,296,334, the teaching of which are incorporated herein by reference in their entirety. Among the problems experienced are poor adhesion of the resist to the surface, particularly when temperature cycling is taken into consideration, inability to obtain suitable photodefinability of the resist, poor adhesion of subsequent metal platings to the surface of the resist, inability of the resist to withstand processing in the various subsequent processing chemicals, and/or inability of the resist to provide the appropriate dielectric properties necessary.

A permanent resist formulation and process which answered most or all of the above cited drawbacks would prove very beneficial in the fabrication of printed circuit boards, surface laminar circuitry packages and other important devices. Surface Laminar Circuitry ("SLC") is a technique whereby glass/epoxy laminate, or other substrates such as copper laminates, polyimides and polyetherimides, and a permanent resist are used to produce a structure resembling that of a semiconductor integrated circuit. This technology represents a change in the design concept of multilayer boards, and was developed to meet the requirements caused by the increasing rise of surface mounted devices for high resolution boards with high terminal pitch and enhanced wiring capability. It is an object of the current invention to provide such a permanent resist formulation and process.

SUMMARY OF THE INVENTION

It is, therefore, an object of the present invention to overcome disadvantages of the prior art. It is another object of the invention to provide a composition which may be thermo setting or photodefinable, but in the context of printing circuits is preferably photodefinable into a permanent resist (i.e. permanent dielectric) which has good adhesion properties both to the surface below it and to the metal subsequently plated onto it. In the thermosetting context the permanent resist may be defined or imaged by screening the permanent resist through a stencil or by blanket coating followed by laser (ablation) definition. It is yet a further object of the invention to provide a permanent dielectric surface which is compatible with various plating solutions and therefore provides improved coverage and platability when plated upon. It is a further object of the current invention to present a composition which is useful as a permanent dielectric on printed circuit boards, surface laminar circuitry packages, and other circuitry packages. Finally it is a still further object of the current invention to develop a permanent dielectric which is capable of imagewise curing or partial curing in response to imagewise photo-radiation exposure and subsequent development in a solvent, preferably an aqueous medium. (e.g. alkali metal carbonate solution in water). As used herein, the terms permanent resist and permanent dielectric shall be synonomous.

These and other objects are accomplished by the present invention which, in one aspect, is a photocurable composition comprising:

(a) optionally, at least one carboxy functional resin;

(b) optionally, at least one acrylate oligomer;

(c) at least two resins, whereby at least one of which has a relatively low molecular weight and at least one of which has a relatively high molecular weight and preferably the resins are epoxy resins, most preferably the resins are bis-phenol-A epoxy resins, (d) at least one photo-initiator which is preferably non-sulfur bearing (if the composition is to be thermally curable then the photoinitiator is replaced by thermal hardner(s)); and (e) optionally, filler.

In another aspect, the present invention relates to the use of the above indicated composition as a permanent defineable dielectric in defining circuitry and vias in the following process:

(a) coating said composition onto a substrate;

(b) curing the coating which remains on the substrate;

(c) optionally, repeating steps (a)–(b);

(d) depositing a conductive material on at least those portions of the substrate which are not covered by the developed imagewise coating so as to form defined circuits and or interconnects on the surfaces, or depositing a conductive material onto the entire surface of the substrate and subsequently defining circuits and interconnects by etching away defined portions of the conductive material.

(e) Optionally repeated steps (a)–(d) so as to build several layers of circuitry.

DETAILED DESCRIPTION OF THE INVENTION

It has been discovered that when the composition of the present invention is used as a permanent dielectric in circuit packages, such as printed circuit boards, various advantages are achievable over the prior art. Firstly, the permanent dielectric formulation of the current invention provides good adhesion of the photodefineable dielectric to the surface to which it is applied. This adhesion is suitable such that delamination of the dielectric from the surface does not occur even after repeated temperature cyclings.

Secondly, the dielectric formulation may be thermally cured, photo cured or a combination of the foregoing. In addition if the dielectric is formulated as photocurable, then, if needed, it may be imaged by imagewise exposure to photo-radiation and subsequently, in its most preferable embodiment, developed using an aqueous alkaline solution. Thus the current invention in this preferred embodiment is soluble or developable in aqueous alkaline solutions, such as a solution of alkali metal carbonate and water. Heretofore, many resist formulations, particularly permanent resist formulations, were developable only in objectionable organic solvents and organic solvent mixtures. Thus developability in an aqueous media provides definite advantages over organic solvent developability because of environmental, safety and cost concerns associated with the former organic solvents. If the dielectric formulation is formulated as being thermally curable, then, if imaging is desired, the dielectric may be imaged by screening it through a stencil or by blanket coating the dielectric material followed by selective laser (ablation) imaging.

Thirdly, this permanent dielectric formulation provides for excellent adhesion of plated metal to its surface. This characteristic of the present formulation is of particular importance. Thus in the past it has been difficult to obtain good metal to permanent resist adhesion while retaining other important dielectric and functional features. This invention, however, provides a permanent dielectric that retains all the generally desired physical properties or resist features while providing excellent plated metal to dielectric adhesion. Adhesion of the plated metal to the permanent resist is typically in the range of 6–8 lbs/in. In addition, these adhesion values are maintained even after temperature cycling such as solder shock for 10 seconds at 288° C. which is the standard test procedure in this industry. Coverage of the plated metal upon or near the permanent resist is also excellent. The addition of fumed silica to the permanent dielectric formulation also improves plated metal to dielectric adhesion. Other specific parameters of the formulation and the plating cycle also assist in increased adhesion of the plated metal to the surface.

Fourthly, this permanent dielectric formulation is generally resistant to subsequent chemical processing. Thus the dielectric and all its properties remain in tact even after the necessary subsequent processing, chemical, thermal and mechanical.

Finally, this permanent dielectric formulation provides excellent dielectric properties which allow it to act as the sole separator between circuit traces in the x, y and z planes. Thus dielectric constants of 3.5 to 3.8 are achievable with the permanent dielectric formulation of the current invention. Thus this invention proposes the formulation of a permanent photodefineable dielectric with desireable properties such as hardness, dielectric properties, resist integrity through and after processing, resist to surface adhesion and plated metal to resist adhesion.

All of the above recited advantages and others are therefore achievable by utilizing a permanent resist formulation comprising:

(a) optionally, at least one carboxy functional resin;

(b) optionally, at least one acrylate oligomer;

(c) at least one crosslinkable resin and at least one high molecular weight resin, whereby the crosslinkable resin has a relatively low molecular weight and the high molecular weight resin has a relatively high molecular weight and preferably both of the foregoing resins are epoxy resins, most preferably both resins are bisphenol-A epoxy resins;

(d) a photoinitiator which is preferably a non-sulfur bearing photoinitiator (if the composition is to be thermally curable then the photoinitiator is replaced by a thermal hardner(s));

(e) optionally a filler, and (f) optionally, at least one reactive monomer, which is preferably an acrylate or methacrylate monomer.

The carboxy functional resin of the proposed formulation is useful in making the formulation developable in aqueous alkali solution as opposed to organic solvent developable and is therefore particularly useful in the photodefinable composition. If used, the carboxy functional resin can be any one or several of various known types such as Morez 100 or 200 styrene acrylic carboxy functional copolymers—available from Morton International, Carboset 527, 526 or 1160— carboxy functional acrylic copolymers—available from B. F. Goodrich Company, or Scripset 550, or 560 available from Monsanto Company. The inventor has found Carboset 526 to be particularly useful in formulating the permanent photodefineable dielectric formulation of this invention. The concentration of the carboxy functional resin in the final permanent resist formulation can range from 2 to 50 weight percent, but is preferably at 5 to 25 weight percent and most preferably at 10 to 15 weight percent.

The acrylate oligomer, if used in the current invention, can consist of any one or several of various known acrylate oligomers, such as CN961E75, CN972, CN120A75, CN120C80, Pro-1100, or Sarbox 350, 400 or 401—styrene maleic anhydride esters of hydroxyethyl methacrylate—all available from the Sartomer Company. The inventors have found Pro-1100 to be particularly useful in formulating these proposed permanent dielectric formulations. The concentration of the acrylate oligomer in the final formulation can range from 20 to 50 weight percent, but is preferably 25 to 40 weight percent and most preferably 30 to 40 weight percent.

The crosslinkable resins and the high molecular weight resins can be a variety of resins or resin mixtures such as epoxy resins, acrylate resins, polyimide resins, polytetra fluoro ethylene resins, polyalkylene resin, polyurethane resins, and mixtures of any of the foregoing but the crosslinkable resins and the high molecular weight resins are preferably epoxy resins and most preferably they are bisphenol-A epoxy resins. Preferred epoxy crosslinkable resins are Epon 828, Epon 1001 and Epon 1004 (available from Shell Chemical Company). One Preferred epoxy high molecular weight resin is Epon 1009 available from Shell Chemical Company. However, the dielectric composition must comprise at least two resins, independently chosen from the foregoing categories of resins, whereby at least one crosslinkable resin is of relatively low molecular weight and at least one high molecular weight resin is of relatively high molecular weight. In the most preferred embodiment, the dielectric composition will contain two crosslinkable resins and preferably the crosslinkable resins (and the high molecular weight resin) are all of the same type (i.e. all are epoxies or all bisphenol-A epoxies). The low molecular weight crosslinkable resin should have a molecular weight in the range of 350 to 1,000, preferably in the range of 300 to 500. The intermediate molecular weight crosslinkable resin, if used, should have a molecular weight in the range of 500 to 1,800, preferably in the range of 800 to 1,200. The high molecular weight resin should have a molecular weight in excess of 5,000, preferably in the range of 5,000 to 9,000. The concentration of the low molecular weight crosslinkable resin in the dielectric composition should be in the range of 15 to 35 weight percent, preferably in the range of 20 to 30 weight percent. The concentration of the intermediate molecular weight crosslinkable resin in the dielectric composition, if used, should be in the range of 15 to 40 weight percent, preferably in the range of 25 to 35 weight percent. The concentration of the high molecular weight resin in the dielectric composition should be in the range of 5 to 20 weight percent, preferably in the range of 10 to 15 weight percent.

One typical low molecular weight crosslinkable resins useful in the invention is Epon 828, available from the Shell Chemical Company. The low molecular weight crosslinkable resin is preferably an oligomer (as opposed to a monomer) which has the ability to crosslink in the ultimate dielectric composition. Some typical intermediate molecular weight crosslinkable resins, if used, useful in the invention are Epon 1001, Epon 3001 and Epon 1004, available from the Shell Chemical Company. The intermediate weight crosslinkable is also preferably an oligomer which has the ability to crosslink in the ultimate dielectric composition. One typical high molecular weight resin useful in the invention, is Epon 1009, available from the Shell Chemical Company. The high molecular weight resin should preferably be chosen such that it is substantially hindered from or unable to substantially crosslink in the ultimate dielectric formulation. The most preferred resins are of the bisphenol-A epoxy type such as Epon 828, Epon 3007 and Epon 1009.

In general the high molecular weight resins should preferably have a hydroxyl to oxirane ratio in excess of 2, preferably in the range of 6 to 8. The low molecular weight crosslinkable resin should preferably have an hydroxyl to oxirane ratio of less than 0. 10, prefereably in the range of 0.04 to 0.03.

If the dielectric composition is formulated to be photodefinable, then the composition should comprise a photoinitiator. Although many photoinitiators can usefully be applied in the formulation of this invention, the inventors have discovered that non-sulfur bearing photoinitiators provide advantages in the platability of the resist. Thus the current invention in its most preferred form, proposes a formulation which comprises only non-sulfur bearing constituents, particularly non-sulfur bearing photoinitiators. The non-sulfur bearing photoinitiators may take one or several known forms such as: Benzoin ethers, alphahydroxy dialkylacetophenones, acyl phosphines, cyclic benzil deravitives, 3-Ketocoumerins, Quinones, Michler's Ketone, and Xanthone.

The inventors have found cyclic benzil derivatives to be a particularly suitable non-sulfur bearing photoinitiator as used in this invention. The concentration of the photoinitiator in the resist formulation may range from 2 to 15 weight percent, but is preferably from 4 to 12 weight percent and most preferably from 8 to 10 weight percent. It is believed that non-sulfur bearing photoinitiators, particularly non-divalent sulfur bearing photoinitiators, provide advantages in the platability of the resin. The inventors discovered that sulfur bearing photoinitiators were incompatible with and interfered with the plating action of many plating baths when those baths were used to plate upon the surface of or near the surface of the permanent photodefineable dielectric which used such sulfur bearing photoinitiators. The permanent photodefineable dielectric formulation of the present invention answers these needs. Non-sulfur bearing as used herein shall mean a composition and/or photoinitiator which does not contain divalent or elemental sulfur.

If the dielectric composition is formulated to be thermally curable, then the composition should comprise a thermal hardner. Typical thermal hardeners are known in the art and include dicyanodiamides, imidazoles and carboxylic acids. In any case the thermal hardener (or the photoinitiator) should be matched to the type of crosslinkable resins chosen. In some cases it may be preferable to incorporate both a photoinitiator and a thermal hardener in the dielectric composition. Optionally, the formulations of the current invention may also contain filler materials such as silica. The inventors have discovered that the use of fumed silica, as opposed to other forms of silica such as amorphous silica, provides advantages. In particular the use of fumed silica as a filler in these compositions provides for improved adhesion of the plated metal to the surface of the resist as compared to compositions with amorphous silica. If used, the concentration of filler in these resist formulations may range from 0.5 to 8 weight percent, but is preferably from 1 to 2 weight percent. As indicated above, the most preferred embodiment of this invention utilizes fumed silica as the filler material.

The reactive monomer, if used, should be capable of undergoing cross-linking within the formulation. Preferably the reactive monomer is a multifunctional acrylate or multifunctional methacrylate monomer. These may include one or several of various known compounds such as polyacrylates, polymethacrylates, 1,6-hexane diol diacrylate, acrylate esters of bisphenol-A based epoxies, tetraethylene glycol diacrylate and the like. The choice of any particular such compound or mixtures thereof will largely be dictated by reactivity for the (meth) acrylate groups, the desired viscosity properties and the like.

In addition to the materials addressed above, other standard additives may also be included in the permanent dielectric composition of this invention. These additional additives include dyes, colors, flow modifiers, antifoams and other known additives.

As indicated this invention is particularly useful as a permanent dielectric composition in fabricating printed circuit boards, surface laminar circuitry packages and other circuitry packages. As used in this manner the following process is proposed:

(a) coating said composition onto the surface of a substrate, preferably in an imagewise fashion if interconnections are to be made to the layer beneath;

(b) curing the coating which remains on the substrate;

(c) optionally, repeating steps (a)–(b);

(d) depositing a conductive material on at least those portions of the substrate which are not covered by the developed imagewise coating so as to form defined circuits and interconnects or depositing a conductive material onto the entire surface of the substrate and subsequently defining circuits and interconnects by etching away defined portions of that conductive material.

(e) Optionally repeating steps (a)–(d) so as to build several layers of circuitry.

As used herein interconnect shall mean an electrical connection between layers of circuitry.

In the proposed process, the permanent dielectric composition may be coated onto the surface of the substrate in a variety of ways, including screening, roller coating, curtain coating, laminating, and spray coating, among others. The viscosity of the composition may be adjusted to suit the coating method and coating thickness desired. If the dielectric composition is formulated to be thermally curable and if imaging of the dielectric is desired, then the imaging can be accomplished either by screening the dielectric composition through a stencil or by blanket coating the dielectric composition (i.e. spray coating, curtain coating, roller coating, laminating, etc.) followed by selective laser (ablation) imaging of the coated dielectric composition. If the dielectric composition is photodefinable, then, after coating, the composition is photodefined by exposing the coated surface to an imagewise pattern of radiation. The radiation most useful in this manner is ultraviolet radiation, but other wavelengths of radiation may be used. Thus in the preferred embodiment of this invention the composition proposed, once coated, is subjected to imagewise ultraviolet radiation in an amount sufficient to partially cure the composition where it has been exposed. The coated, exposed composition is then developed using a solution which selectively removes the non-exposed areas of the coating. One particular advantage of the preferred resist formulations is that they are developable in aqueous solution as opposed to environmentally unsafe, hazardous and objectionable solvents. Thus in the preferred embodiment of this invention, the coated, exposed composition is developed in an aqueous solution of sodium or potassium carbonate, such that only the unexposed areas are removed from the surface.

Whether photodefinable or thermally cured, it is typical to further cure the dielectric composition which is now on the surface. As such, this additional curing is accomplished by additional exposure to heat and/or photo-radiation, as appropriate.

Finally the process proposes that a conductive material be deposited upon at least those portions of the substrate which are not covered with the dielectric. Thus it is proposed that plating can occur on only those areas where the dielectric has been removed by development, if photodefinable, or if thermally cured, where the dielectric does not cover the substrate (additive production of the circuits), on the entire surface including areas where the dielectric does not cover the substrate as well as upon the dielectric itself (subtractive production of the circuits) or some degree of plating falling between these extremes (semi-additive production of the circuits). For a discussion of the specifics of circuitry and interconnect creation see U.S. Pat. No. 4,847,114 (Brasch et. al.), the teachings of which are incorporated herein by reference in their entirety.

If the additive process is chosen at this point the entire surface will be activated to accept plating. A plating mask will then be applied and then plating will occur in those areas where the dielectric is not covering the substrate and upon the surface of the dielectric in a defined manner as dictated by the plating mask such that defined circuitry and interconnects are created. Thus, the plating itself will define the circuitry and other features desired. In the additive process the definition of the dielectric will create and define the holes and vias which will interconnect the various layers of the circuitry package. If subtractive processing is chosen then the entire surface will be plated. The circuitry and other features will be defined by subsequent selective etching of the plated metal. In the subtractive manner, the definition of the dielectric will typically be used for the creation of holes and vias which connect the various layers of the circuitry package.

This brings out an additional advantage of the proposed composition and process. Because of its permanent nature, the dielectric of this invention is useful notably in defining the holes and vias used to interconnect the layers of circuitry in the package. In addition, this permanent dielectric is used to separate the circuitry in all three spacial directions. Because of its ability (due to dielectric and other properties) to separate and insulate the circuitry within a layer and from layer to layer, this permanent dielectric can be used to define the holes of the circuitry package. Photolithography is preferred to mechanical drilling (the typical method of creating holes and vias) because smaller holes and vias can be created, and the holes and vias are formed and processed with greater ease and economy, in general, as compared to mechanical drilling. Holes and vias as small as 1.0 mil in diameter can be created.

Whichever type of processing is chosen (additive, substractive, or semi-additive), the surface plating can be accomplished in several ways. The most typical way is the use of known electroless plating techniques to plate either copper, nickel, or some other appropriate metal onto the desired surface. These techniques may include chemical roughening of the surface, conditioning, activation, acceleration and electroless plating. All of these steps are generally known and are described in U.S. Pat. Nos. 4,976,990 (Bach et. al.) and 4,834,796, the teachings both of which are incorporated herein by reference in their entirety.

Other methods of depositing metals onto the desired surfaces are known and may be utilized. These include direct metalization techniques such as those described in U.S. Pat. No. 4,724,005 (Minten et. al.), the teachings of which are incorporated herein by reference in their entirety. As an alternative, chemical vapor deposition may be utilized, in addition to a variety of other known methods for metal deposition upon non-conductive surfaces.

The composition and process of the proposed invention is further described by the following examples which are intended merely for additional description but are not limiting in any way.

Example I

The following composition was prepared:

| Component | Percentage by Weight |
| --- | --- |
| Epon 828 | 25.0 |
| Epon 3001 | 26.0 |
| Epon 1009 | 11.0 |
| Modaflow | 1.5 |
| Diethylene glycol ethyl ether | 13.7 |
| Propylene glycol monomethyl ether acetate | 14.8 |
| Dicyanodiamide | 6.0 |
| Flow additive | 1.0 |

1. Application of Dielectric

After preparation, the composition was mixed in proper proportion and coated onto the surface of a cleaned and prepared copper coated epoxy/glass laminate by means of screen coating. The coating thickness was 1 mil (wet) and the dielectric was coated in an imagewise fashion using an appropriately stenciled screen. The coated copper surface was then dried and cured at 300F for 60 minutes.

2. Plating

The surface was then plated using the following plating process (cycle):

| Process Step @ | Time (min) | Temperature (° F.) |
| --- | --- | --- |
| 1. Solvent Swellant | 3 | 110 |
| 2. Permanganate Etch | 5 | 165 |
| 3. Permanganate Reducer | 4 | 120 |
| 4. Condition | 5 | 120 |
| 5. Copper Microetch | 2 | 90 |
| 6. Activate | 5 | 90 |
| 7. Accellerate | 2 | 120 |
| 8. Electroless Metal Deposition | 15 | 95 |
| 9. Electrolytic Copper Flash | 5 | 80 |
| 10. Photo-Resist Application | | |
| 11. Pattern Plate Copper | | |
| 12. Pattern Plate Tin | | |
| 13. Strip the Photo-Resist | | |
| 14. Etch exposed Copper | | |
| 15. Strip Tin resist. | | |

Note: Fresh water rinses were interposed between chemical process steps and at the end of processing.

Note: Fresh water rinses were interposed between chemical process steps and at the end of processing.

@The products used for each of the foregoing process steps are generally known in the plating art and are readily available from several companies including MacDermid, Incorporated of Waterbury, Conn. The plating process is generally described in U.S. Pat. No. 4,976,990. The adhesion of the plated metal to the permanent dielectric surface was excellent. No blistering or peeling was observed. The adhesion of the plated metal to the dielectric surface was measured to be 8 lbs/in. In addition, the coverage of the dielectric surface with the plated metal was excellent. Substantially no voids in coverage were observed.

Example II

Example I was repeated except that the three epoxy crosslinkable resins were replaced by a single epoxy crosslinkable resin. The composition was therefore the following:

| Component | Percentage by Weight |
| --- | --- |
| Epon 3001 | 62.0 |
| Propylene glycol monomethyl ether actate | 23.5 |
| Dicyanodiamide | 6.0 |
| Moda flow | 1.5 |
| Flow additive | 1.0 |

The results yielded poor adhesion of the plated metal to the permanent dielectric surface. Significant blistering and peeling of the metal from the dielectric surface was observed. The adhesion of the metal to the dielectric surface was measured to be less than 3 lb/in. Because of the blistering and peeling, coverage could not be evaluated accurately.

Example III

Example I was repeated except that the photoinitiator was replaced with a sulfur bearing photoinitiator (Irgacure 907, Ciba Geigy Co.) at the same concentration.

The results yielded poor coverage of the permanent dielectric surface with the plated metal. Significant voids in the plating were observed. In addition a black smut was observed in the voids and on the metal surfaces. Because of the significant voiding, adhesion could not be evaluated accurately.

Although not wishing to be bound by theory, the inventor currently believes that the mixture of crosslinkable resins and high molecular weight resins of widely varying molecular weights, as given herein, causes the high molecular weight resin molecules to fold in on themselves forming relatively large discrete globules of high molecular weight resin in a matrix of low molecular weight resin such that a controlled quasi-phase separation occurs. The reason for this high molecular weight globule formulation is the differing surface energies created by the mixture and the tendency for polymers to form low energy configurations in solution.

When the mixture subsequently cures, the low molecular weight crosslinkable resins will have a higher crosslink density than the high molecular weight globules due to the hindered nature of the globules and due to the fact that the lower molecular crosslinkable weight resin will have a higher concentration of crosslink functionality (i.e. oxirane functionality if it is epoxy) than the high molecular weight resin.

As a result of the difference in crosslink densities between the high and low molecular weight resins, the dielectric etch steps of the plating process (i.e. solvent swell, permanganate etchant and permanganate neutralizer) etch the surface more effectively thereby creating a surface that is more conducive to plating. In effect, the high molecular weight globules are more susceptible to etching than the low molecular weight matrix and the differential etching creates ideal surface topography for plating. Care should be taken in the selection of the resins such that when mixed the resins do not exhibit gross phase separation as opposed to the globule formation described above. Depending upon the type of resins chosen, gross phase separation can occur if the molecular weight range between the resins is too extreme. Gross phase separation is less likely to occur if the resins are all of the same type (i.e. epoxies or bisphenol-A epoxies).

What is claimed is:

1. A process for fabricating a circuitry package comprising:

(a) Coating the surface of a substrate with a composition comprising:

(1) at least one crosslinkable resin and at least one high molecular weight resin; and (2) at least one curing agent selected from the group consisting of photoinitiators, thermal hardners, and mixtures thereof;

wherein at least one high molecular weight resin has a molecular weight in excess of about 5,000 and a hydroxyl to oxirane ratio greater than 2 and wherein at least one crosslinkable resin has a molecular weight less than about 1,000 and a hydroxyl to oxirane ratio of less than 0.10;

(b) curing the coating on the surface;

(c) optionally, repeating steps (a)–(b);

(d) depositing a conductive material on the coating;

(e) optionally, repeating steps (a) through (d).

2. A process according to claim 1 wherein the composition is coated onto the surface in an imagewise manner.

3. A process according to claim 2 wherein the curing agent comprises a thermal hardener and wherein the crosslinkable resins comprise:

(a) a bisphenol-A epoxy resin with a molecular weight in the range of 350 to 1,000; and (b) a bisphenol-A epoxy resin with a molecular weight in the range of 500 to 1,800 and wherein the high molecular weight resin comprises a bisphenol-A epoxy resin with a molecular weight in the range of 5,000 to 9,000.

4. A process according to claim 1 wherein the crosslinkable resins and the high molecular weight resins comprise bisphenol-A epoxy resins.

5. A process according to claim 1 wherein the conductive material is electrolessly plated.

6. A process according to claim 1 wherein the curing agent is a thermal hardener.

7. A process according to claim 1 wherein the crosslinkable resins and the high molecular weight resins comprise epoxy resins.

8. A process according to claim 1 wherein the curing agent is a photoinitiator and wherein the process additionally comprises the following process steps prior to curing the coating:

(a) exposing the coating to an imagewise pattern of radiation, to which the composition is responsive, in an amount sufficient to at least partially cure the exposed areas of the composition; and (b) developing the exposed composition with a solution which will selectively remove the non-exposed areas of the coating.

9. A process according to claim 8 wherein the composition also comprises:

(a) at least one carboxy functional resin;

(b) at least one acrylate oligomer; and (c) at least one reactive monomer.

10. A process according to claim 1 wherein the process also comprises selectively laser ablating areas of the coating prior to depositing the conductive material.

11. A process according to claim 10 wherein the curing agent comprises a thermal hardener.

12. A process according to claim 10 wherein the curing agent comprises a thermal hardener and wherein the resins comprise:

(a) a crosslinkable resin with a molecular weight in the range of 350 to 1,000; and (b) a high molecular weight resin with a molecular weight in the range of 5,000 to 9,000.

13. A process according to claim 12 wherein the crosslinkable resins also comprise a second crosslinkable resin with a molecular weight in the range of 500 to 1,800.

14. A process according to claim 13 wherein the crosslinkable resins and the high molecular weight resins comprise bisphenol-A epoxy resins.

15. A process according to claim 1 wherein the resins comprise:

(a) a crosslinkable resin with a molecular weight in the range of 350 to 1,000 and (b) a high molecular weight resin with a molecular weight in the range of 5,000 to 9,000.

16. A process according to 15 wherein the crosslinkable resins also comprise a second crosslinkable resin with a molecular weight in the range of 500 to 1,800.

17. A process according to claim 15 wherein the crosslinkable resins and the high molecular weight resins comprise bisphenol-A epoxy resins.

* * * * *